United States Patent
Venkata et al.

(10) Patent No.: US 8,812,893 B1
(45) Date of Patent: Aug. 19, 2014

(54) APPARATUS AND METHODS FOR LOW-SKEW CHANNEL BONDING

(75) Inventors: Ramanand Venkata, Fremont, CA (US); Henry Y. Lui, Millbrae, CA (US)

(73) Assignee: Altera Corporation, San Jose, CA (US)

(*) Notice: Subject to any disclaimer, the term of this patent is extended or adjusted under 35 U.S.C. 154(b) by 211 days.

(21) Appl. No.: 13/486,482

(22) Filed: Jun. 1, 2012

(51) Int. Cl.
*G06F 1/04* (2006.01)
*H03K 21/00* (2006.01)

(52) U.S. Cl.
USPC .......................... 713/503; 327/115; 327/208

(58) Field of Classification Search
CPC .................................. G06F 1/12; H03K 21/08
USPC ..................... 713/503; 327/115, 208
See application file for complete search history.

(56) References Cited

U.S. PATENT DOCUMENTS

| | | | |
|---|---|---|---|
| 5,280,539 A * | 1/1994 | Yeom et al. | 375/354 |
| 7,602,212 B1 | 10/2009 | Chan et al. | |
| 7,791,370 B1 | 9/2010 | Hoang et al. | |
| 7,812,634 B1 | 10/2010 | Shumarayev et al. | |
| 7,860,203 B1 | 12/2010 | Shumarayev et al. | |
| 8,059,677 B1 | 11/2011 | Duwel et al. | |
| 8,081,706 B2 | 12/2011 | Shumarayev | |
| 2003/0185336 A1 * | 10/2003 | Chu | 377/47 |
| 2005/0127959 A1 * | 6/2005 | Leifso et al. | 327/117 |
| 2006/0158237 A1 * | 7/2006 | Austin et al. | 327/208 |
| 2006/0197611 A1 * | 9/2006 | Yan | 331/16 |
| 2012/0194228 A1 * | 8/2012 | Choi | 327/117 |
| 2013/0049820 A1 * | 2/2013 | Ide | 327/115 |
| 2013/0169313 A1 * | 7/2013 | Pace | 326/93 |

* cited by examiner

*Primary Examiner* — Vincent Tran
(74) *Attorney, Agent, or Firm* — Okamoto & Benedicto LLP (57) ABSTRACT

One embodiment relates an apparatus which includes a plurality of local synchronous divider circuits, each local synchronous divider circuit being configured to receive a serial clock signal and a reset signal and generate a local clock signal. The apparatus further includes a clock distribution network configured to distribute the serial clock signal to the plurality of local synchronous divider circuits and a signal distribution network configured to distribute the reset signal to the plurality of local synchronous divider circuits. Another embodiment relates to a method of distributing a serial clock signal and a reset signal to a plurality of local synchronous divider circuits and generating a local clock signal at each of the plurality of local synchronous divider circuits. Other embodiments, aspects, and features are also disclosed.

13 Claims, 6 Drawing Sheets

APPARATUS AND METHODS FOR LOW-SKEW CHANNEL BONDING

BACKGROUND

1. Technical Field

The present invention relates generally to data communication circuits, including serial interface circuits.

2. Description of the Background Art

High speed serial interfaces (HSSI) may be configured to transmit data on multiple channels. Unfortunately, substantial skew may accumulate along the path from the transmission to reception of the multiple-channel data. The path may be a few inches long if chip-to-chip or many miles long if box-to-box.

HSSI protocols typically limit skew to a few unit intervals (UI) or less between transmission pins on an integrated circuit. Otherwise, excessive skew results in the need for deep deskew buffers at the receiver, which is expensive and increases network latency.

SUMMARY

One embodiment relates an apparatus which includes a plurality of local synchronous divider circuits, each local synchronous divider circuit being configured to receive a serial clock signal and a reset signal and generate a local clock signal. The apparatus further includes a clock distribution network configured to distribute the serial clock signal to the plurality of local synchronous divider circuits and a signal distribution network configured to distribute the reset signal to the plurality of local synchronous divider circuits.

Another embodiment relates to a method of distributing a serial clock signal and a reset signal to a plurality of local synchronous divider circuits. A local clock signal is then generated at each of the plurality of local synchronous divider circuits.

Another embodiment relates to a synchronous divider circuit. The synchronous divider circuit has a first input configured to receive a reset signal and a second input configured to receive a serial clock signal. The synchronous divider circuit includes at least an inverter and first and second latches. The inverter is configured to invert the serial clock signal to generate an inverted serial clock signal. The data input of the first latch is configured to receive the reset signal, and the clock input of the first latch is configured to receive the inverted serial clock signal. the data input of the second latch is configured to receive the reset signal, and the clock input of the second latch is configured to receive the serial clock signal.

Other embodiments, aspects, and features are also disclosed.

DETAILED DESCRIPTION

Previous solutions to address channel-to-channel transmission skew involve relatively complicated schemes. In these schemes, serial and parallel clocks are generally sent from a master channel to other channels in the group to be "bonded" together with low skew. Calibration procedures are applied to reduce inter-channel and inter-clock skew. For example, variable delay buffers may be calibrated to account for process variations in the transmit clock network so as to reduce the inter-channel skew. In addition, voltage regulators may be calibrated to reduce the inter-clock skew between the serial and parallel clocks.

The present disclosure provides methods and apparatus which efficiently address problems relating to skew between bonded transmit channels in a serial interface and may be advantageously utilized to ensure compliance to wake-up time specifications of high-speed serial interface protocols. The methods and apparatus disclosed herein substantially reduce the need for the prior calibration procedures. The need for programmable-delay calibration is reduced or eliminated because the inter-channel skew is fixed at 0.5 UI by using core clock trees to distribute a reset signal to all the channels to be bonded. The need for voltage-regulator calibration is reduced or eliminated because the parallel clock is generated locally.

Figure 1:
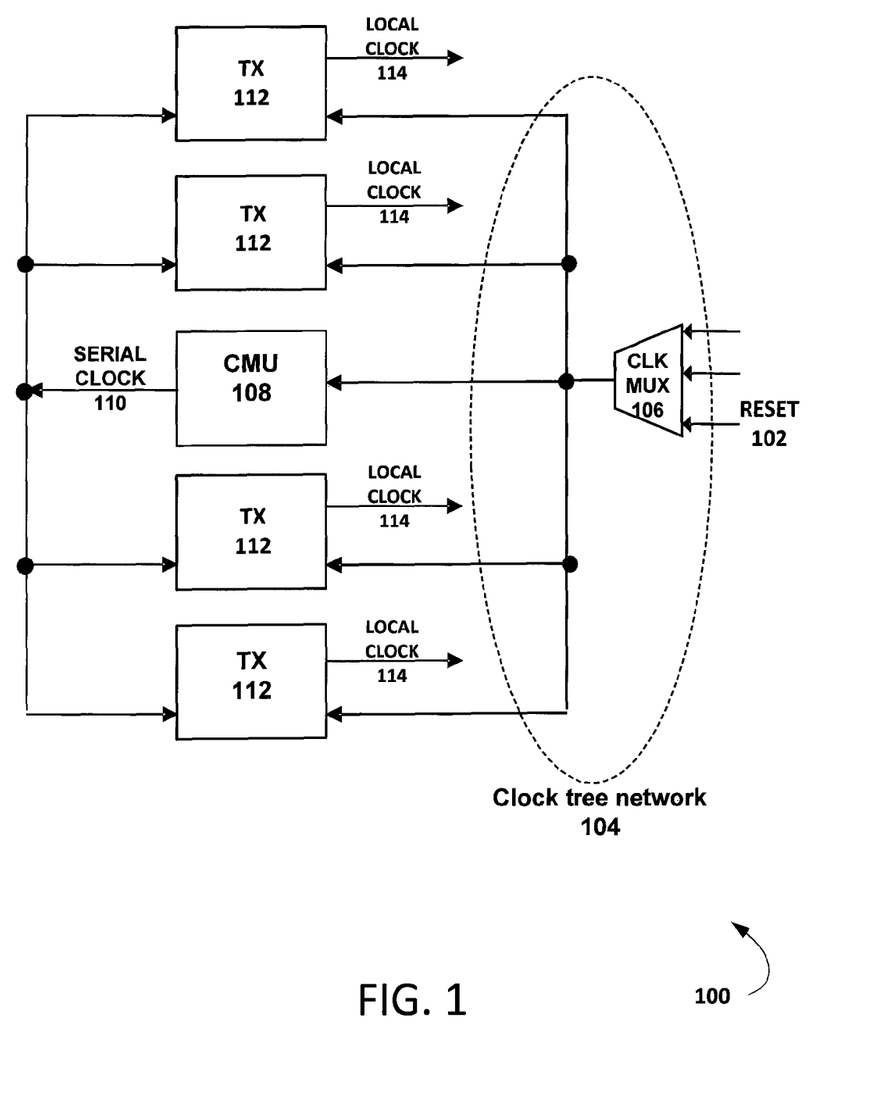
FIG. 1 depicts an exemplary signal distribution circuit for channel bonding in accordance with an embodiment of the invention.

FIG. 1 depicts an exemplary signal distribution circuit 100 for channel bonding in accordance with an embodiment of the invention. As shown, a reset signal (RESET) 102 may be provided via a controllable selector (CLK MUX) 106 to a clock tree network 104. The clock tree network 104 may be configured to distribute the reset signal 102 to a clock management unit (CMU) 108 and to multiple transmitter channel (TX) circuits 112. The CMU 108 is configured to provide and distribute a serial clock 110 to the multiple TX circuits 112.

The reset 102 and the serial clock 110 signals are distributed to each of the TX circuits 112 to be bonded. Each TX circuit 112 receives the reset 102 and serial clock 110 signals and outputs a local clock signal 114. The local clock signal 114 is used as the parallel clock signal for the TX circuit 112 in which it is generated.

While four TX circuits 112 are shown as being configured to be bonded in the exemplary signal distribution circuit 100 depicted in FIG. 1, other numbers of TX circuits 112 may be configured to be bonded in other implementations. In general, the number of TX circuits 112 to be bonded may be two or more, depending on the specification of the serial interface.

Figure 2:
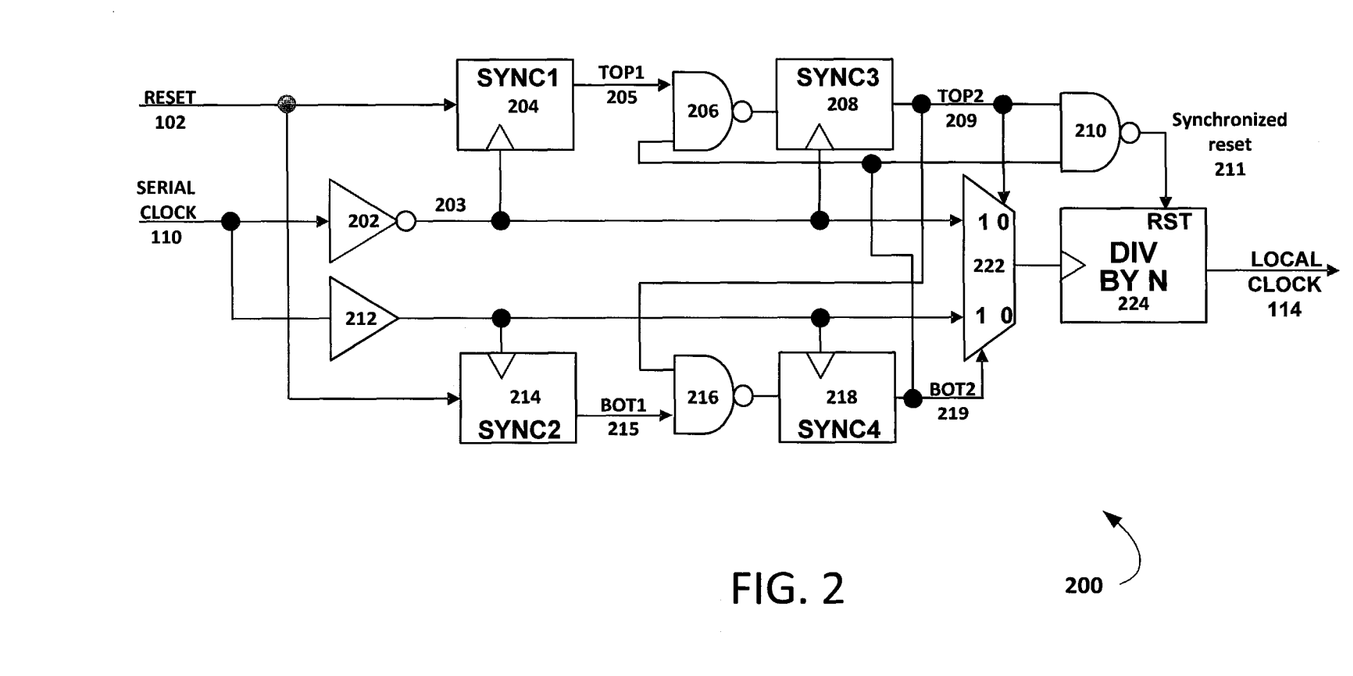
FIG. 2 depicts an exemplary circuit for a local synchronous divider in accordance with an embodiment of the invention.

FIG. 2 depicts an exemplary local synchronous divider circuit 200 in accordance with an embodiment of the invention. An instance of the local synchronous divider circuit 200 may be implemented within each of the TX circuits 112 to be bonded. As shown, the local synchronous divider circuit 200 receives the reset 102 and the serial clock 110 signals and outputs the local clock signal 114.

The reset signal 102 provided to the data inputs of a first top synchronous latch (SYNC1) 204 and a first bottom synchronous latch (SYNC2) 214. The output (TOP1) 205 of SYNC1 204 is provided to a first input of a top NAND gate 206, and the output (BOT1) 215 of SYNC2 214 is provided to a first input of a bottom NAND gate 216.

The output of the top NAND gate 206 is provided to the data input of a second top synchronous latch (SYNC3) 208. The output of the bottom NAND gate 216 is provided to the data input of a second bottom synchronous latch (SYNC4)

218. The output (TOP2) 209 of SYNC3 208 is provided to a second input of the bottom NAND gate 216, a first input of a last NAND gate 210, and a top control input of a clock selector 222. The output (BOT2) 219 of SYNC 4 218 is provided to a second input of the top NAND gate 206, a second input of the last NAND gate 210, and a bottom control input of the clock selector 222.

The serial clock signal 110 is provided to an inverter 202 and the delay element 212. The output of the inverter 202 (the inverted serial clock) is provided to the clock inputs of SYNC1 204 and SYNC3 208 and to a top clock input of the clock selector 222. The output of the delay element 212 (the serial clock) is provided to the clock inputs of SYNC2 214 and SYNC4 218 and to a bottom clock input of the clock selector 222.

The clock selector 222 is controlled by the top and bottom control inputs (TOP2 and BOT2, respectively) as follows. When TOP2 is low and BOT2 is high, then the top clock input which is the inverted clock signal 203 is selected for output by the clock selector 222. When TOP2 is high and BOT2 is low, then the bottom clock input which is the serial clock signal 110 is selected for output by the clock selector 222.

The output signal of the clock selector 222 is received at the clock input of the divide-by-N (DIV BY N) circuit 224. An synchronized reset signal 211 which is the output by the last NAND gate is provided to the reset input of the divide-by-N (DIV BY N) circuit 224. The resultant output of the divide-by-N circuit 224 is the local clock signal 114.

Figure 3:
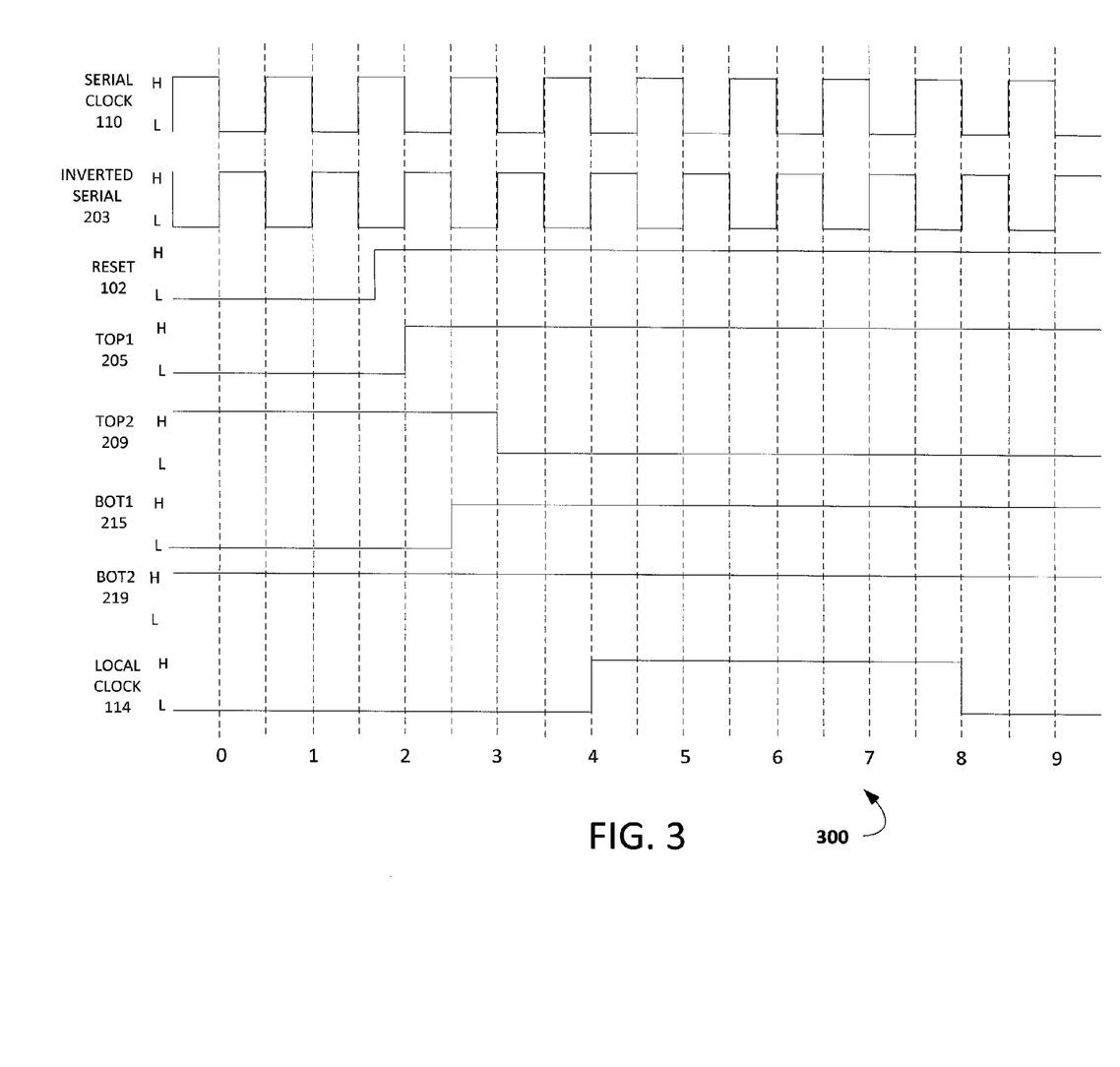
FIG. 3 is a first exemplary timing diagram for the local synchronous divider in accordance with an embodiment of the invention.

FIG. 3 is a first exemplary timing diagram 300 for the local synchronous divider 200 in accordance with an embodiment of the invention. This timing diagram 300 relates to the case where the transition in the reset signal 102 is latched by the first top synchronous latch (SYNC1) 204 prior to its being latched by the first bottom synchronous latch (SYNC2) 214. In this case, as described below, the local clock signal 114 is triggered by the inverted serial clock signal 203.

As shown, in an initial state, the reset 102, TOP1 205, and BOT1 215 signals may be low, and the TOP2 209 and BOT2 219 signals may be high. In this case, when the reset signal 102 is asserted and transitions to a high state, it is first latched (captured) by the SYNC1 latch 204 such that the TOP1 signal 205 transitions from a low state to a high state at the following upward transition (at time 2) of the inverted serial clock signal 203. This causes the output of the top NAND gate 206 to transition from high to low. As a result, the TOP2 signal 209 transitions from high to low at the subsequent upward transition (at time 3) of the inverted serial clock signal 203.

The downward transition of the TOP2 signal 209 causes the top control input of the clock selector 222 to transition from high to low so as to output the inverted serial clock signal 203 to the clock input of the divide-by-N circuit 224. In addition, the downward transition of the TOP2 signal 209 causes the synchronized reset signal 211 to transition from low to high. As a result, the local clock signal 114 is activated and begins at a next upward transition of the inverted serial clock signal 203 (at time 4). In this illustrative example, the divide-by-N circuit 224 is a divide-by-4 circuit (i.e. N=4). Other numbers for N may be used to generate other clock periods for the local clock signal 114.

Note that, per the timing diagram 300 of FIG. 3, the SYNC2 latch 214 also latches (captures) the reset signal 102. However, it does so a half cycle after the SYNC1 latch 204 latches (captures) the reset signal 102. As a result, while the BOT1 signal 215 transitions from low to high (at time 2.5), the BOT2 signal 219 does not make a transition from high to low. This is because the TOP2 signal 209 makes an earlier transition from high to low which keeps the output of the bottom NAND gate 216 at a high state (despite the BOT1 signal 215 transitioning from low to high).

Figure 4:
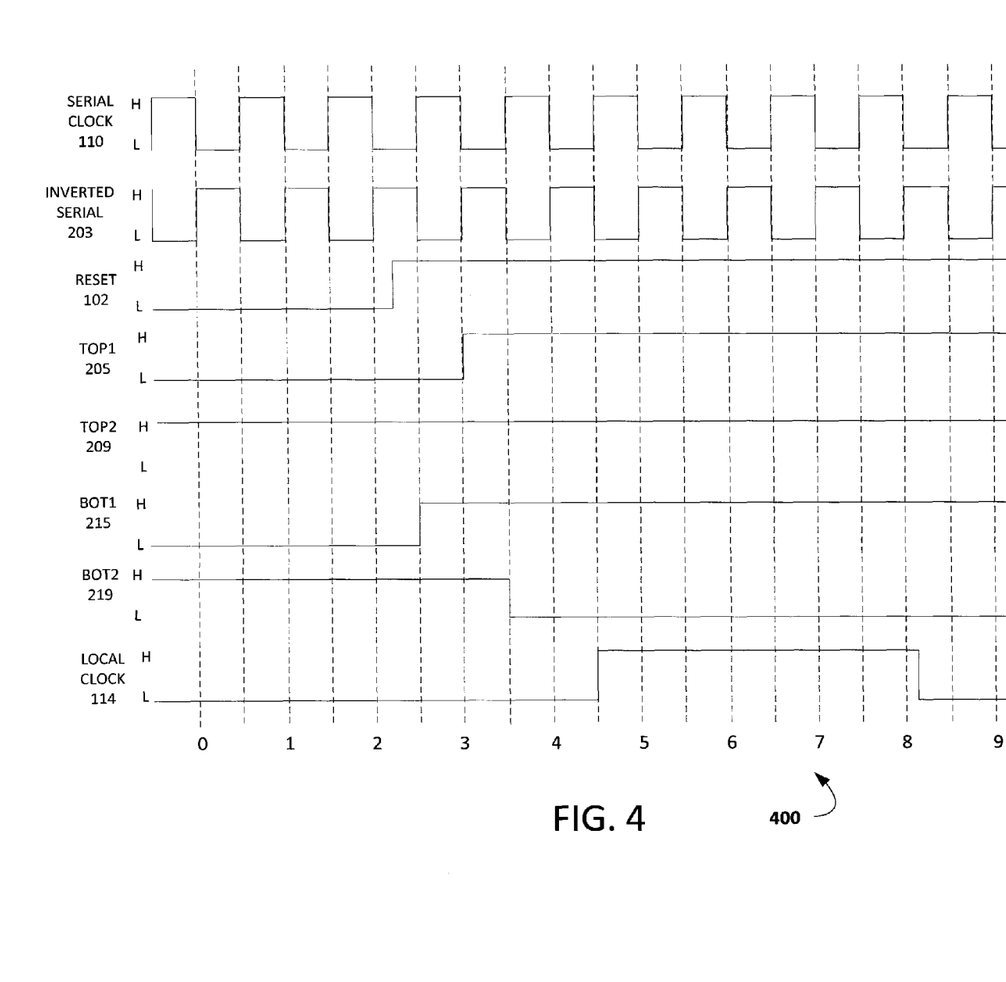
FIG. 4 is a second exemplary timing diagram for the local synchronous divider in accordance with an embodiment of the invention.

FIG. 4 is a second exemplary timing diagram 400 for the local synchronous divider 200 in accordance with an embodiment of the invention. This timing diagram 400 relates to the case where the transition in the reset signal 102 is latched by the first bottom synchronous latch (SYNC2) 214 prior to its being latched by the first top synchronous latch (SYNC1) 204. In this case, as described below, the local clock signal 114 is triggered by the serial clock signal 110.

As shown, in an initial state, the reset 102, TOP1 205, and BOT1 215 signals may be low, and the TOP2 209 and BOT2 219 signals may be high. In this case, when the reset signal 102 is asserted and transitions to a high state, it is first latched (captured) by the SYNC2 latch 214 such that the BOT1 signal 215 transitions from a low state to a high state at the following upward transition (at time 2.5) of the serial clock signal 110. This causes the output of the bottom NAND gate 216 to transition from high to low. As a result, the BOT2 signal 219 transitions from high to low at the subsequent upward transition (at time 3.5) of the serial clock signal 110.

The downward transition of the BOT2 signal 219 causes the bottom control input of the clock selector 222 to transition from high to low so as to output the serial clock signal 110 to the clock input of the divide-by-N circuit 224. In addition, the downward transition of the BOT2 signal 219 causes the synchronized reset signal 211 to transition from low to high. As a result, the local clock signal 114 is activated and begins at a next upward transition of the serial clock signal 110 (at time 4.5). In this illustrative example, the divide-by-N circuit 224 is a divide-by-4 circuit (i.e. N=4). Other numbers for N may be used to generate other clock periods for the local clock signal 114.

Note that, per the timing diagram 400 of FIG. 4, the SYNC1 latch 204 also latches (captures) the reset signal 102. However, it does so a half cycle after the SYNC2 latch 214 latches (captures) the reset signal 102. As a result, while the TOP1 signal 205 transitions from low to high (at time 3), the TOP2 signal 209 does not make a transition from high to low. This is because the BOT2 signal 219 makes an earlier transition from high to low which keeps the output of the top NAND gate 206 at a high state (despite the TOP1 signal 205 transitioning from low to high).

Figure 5:
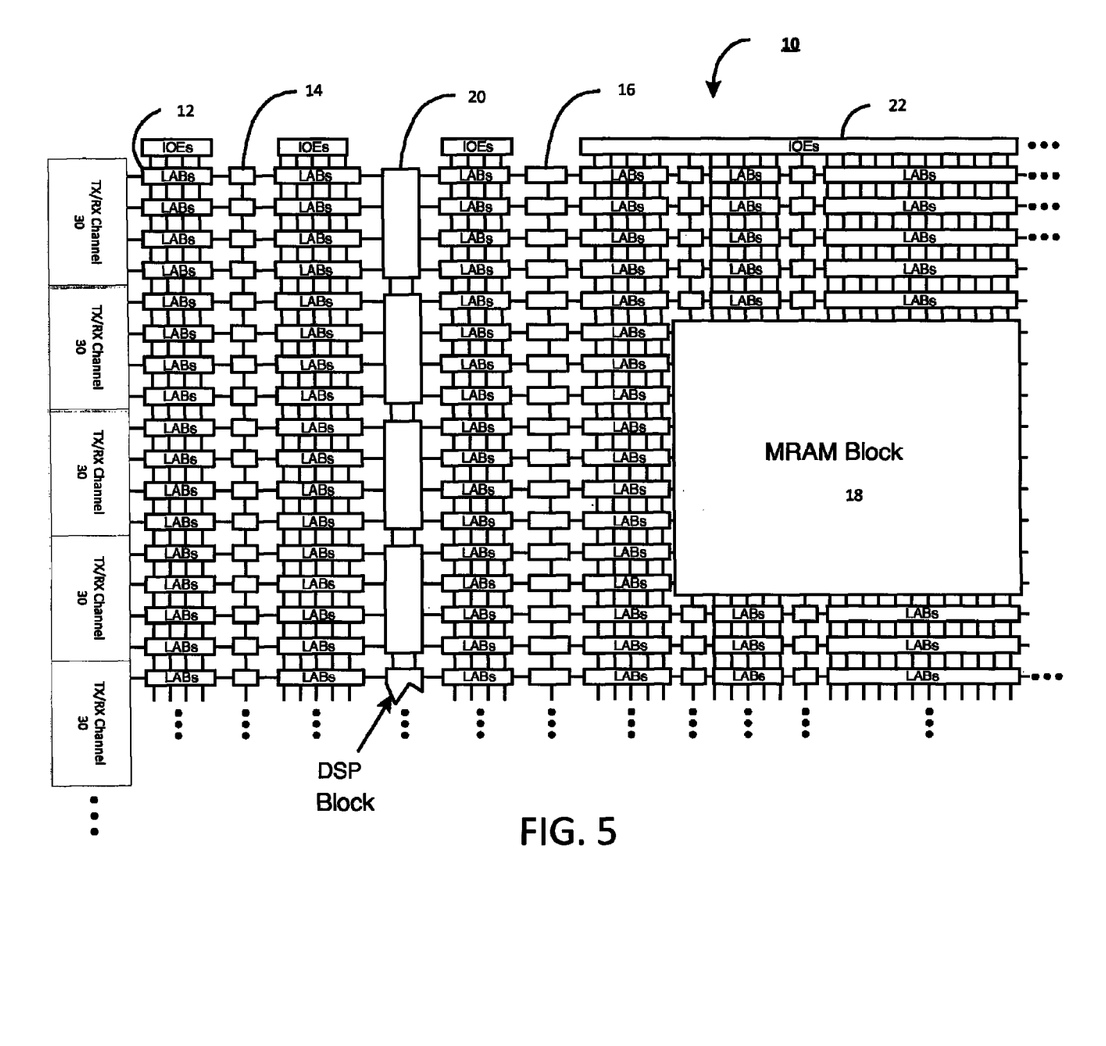
FIG. 5 is a simplified partial block diagram of an exemplary field programmable gate array (FPGA) that may be configured to implement an embodiment of the present invention.

FIG. 5 is a simplified partial block diagram of an exemplary field programmable gate array (FPGA) 10 that may be configured to implement an embodiment of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10.

A transceiver (TX/RX) channel array may be arranged as shown, for example, with each TX/RX channel circuit 30 being coupled to several LABs. Each TX/RX channel circuit 30 may include, among other circuitry, a TX channel circuit with a local synchronous divider circuit such as disclosed herein. In addition, a reset tree such as disclosed herein may be included for bonding multiple TX channels. The channel bonding circuitry disclosed herein may advantageously utilize an otherwise un-used clock tree that is provided within the FPGA 10. For example, an un-used core clock tree may be utilized. Alternatively, other clock trees, such as a quadrant clock tree or a periphery clock tree may be utilized.

It is to be understood that FPGA 10 is described herein for illustrative purposes only and that the present invention can be implemented in many different types of PLDs, FPGAs, and ASICs.

Figure 6:
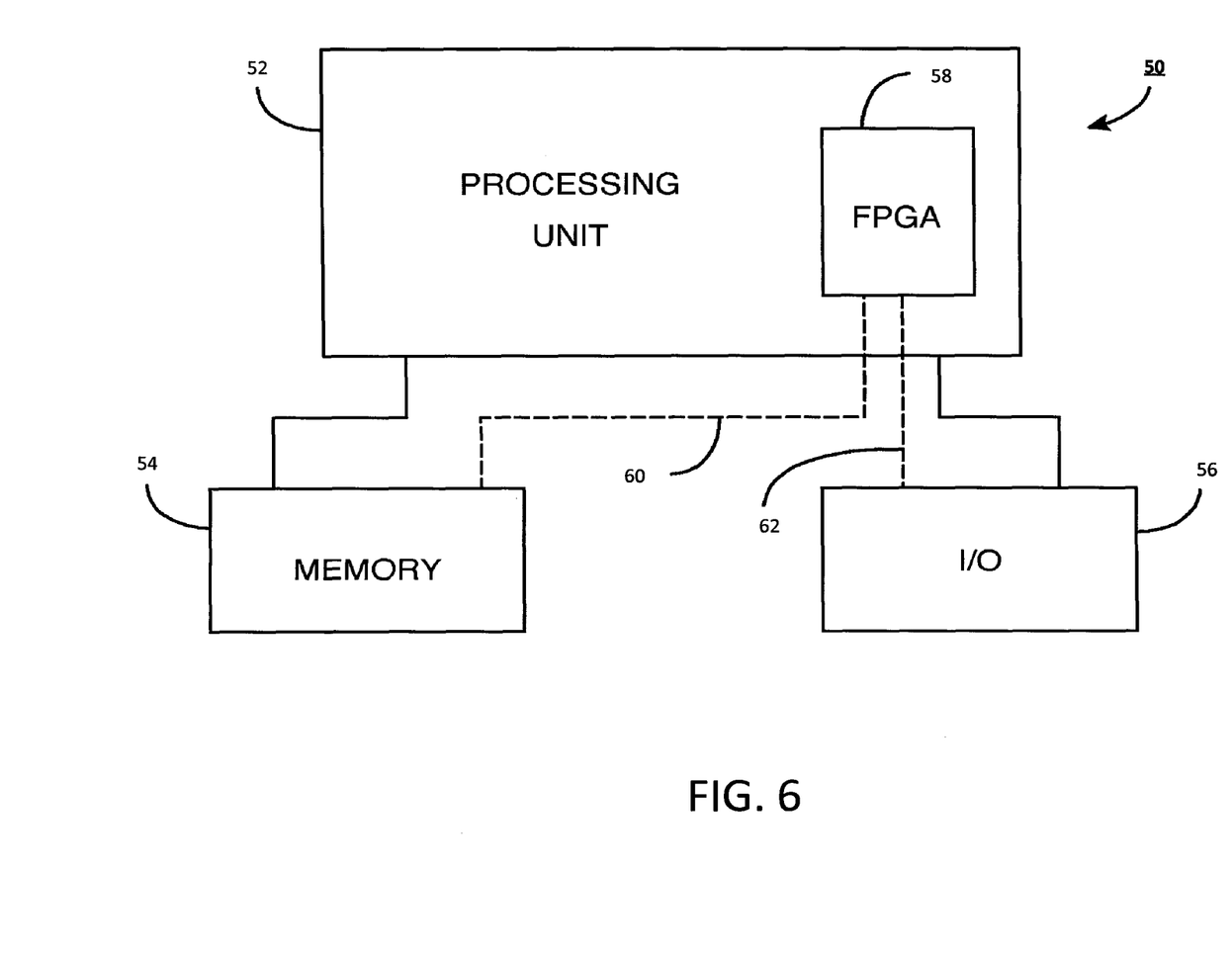
FIG. 6 shows a block diagram of an exemplary digital system that may employ PDN noise reduction techniques as disclosed herein.

FIG. 8 shows a block diagram of an exemplary digital system 50 that may employ techniques disclosed herein. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An apparatus comprising:
a plurality of local synchronous divider circuits, each local synchronous divider circuit being configured to receive a serial clock signal and a reset signal and generate a local clock signal;
a clock distribution network configured to distribute the serial clock signal to the plurality of local synchronous divider circuits; and
a signal distribution network configured to distribute the reset signal to the plurality of local synchronous divider circuits, wherein each local synchronous divider circuit of the plurality of local synchronous divider circuits comprises
an inverter configured to invert the serial clock signal to generate an inverted serial clock signal, and
synchronizing circuitry configured to generate a synchronized reset signal by synchronizing the reset signal into either a first clock domain of the serial clock signal or a second clock domain of the inverted serial clock signal, wherein the synchronizing circuitry comprises
a first latch which is configured to receive the reset signal and to be triggered by an edge of the inverted serial clock signal,
a second latch which is configured to receive the reset signal and to be triggered by an edge of the serial clock signal, and
logic and latch circuitry configured to synchronize the reset signal to the edge of the inverted serial clock signal if the first latch latches the reset signal before the second latch latches the reset signal and configured to synchronize the reset signal to the edge of the serial clock signal if the second latch latches the reset signal before the first latch latches the reset signal.

2. An apparatus comprising:
a plurality of local synchronous divider circuits, each local synchronous divider circuit being configured to receive a serial clock signal and a reset signal and generate a local clock signal;
a clock distribution network configured to distribute the serial clock signal to the plurality of local synchronous divider circuits;
a signal distribution network configured to distribute the reset signal to the plurality of local synchronous divider circuits, wherein each local synchronous divider circuit of the plurality of local synchronous divider circuits comprises
an inverter configured to invert the serial clock signal to generate an inverted serial clock signal, and
synchronizing circuitry configured to generate a synchronized reset signal by synchronizing the reset signal into either a first clock domain of the serial clock signal or a second clock domain of the inverted serial clock signal; and
a clock selector configured to select the inverted serial clock signal as an input clock signal if the if the first latch latches the reset signal before the second latch latches the reset signal and to select the serial clock signal as the input clock signal if the second latch latches the reset signal before the first latch latches the reset signal.

3. The apparatus of claim 2, further comprising:
a divide-by-N circuit configured to divide the input clock signal to generate the local clock signal.

4. An apparatus comprising:
a plurality of local synchronous divider circuits, each local synchronous divider circuit being configured to receive a serial clock signal and a reset signal and generate a local clock signal;
a clock distribution network configured to distribute the serial clock signal to the plurality of local synchronous divider circuits; and
a signal distribution network configured to distribute the reset signal to the plurality of local synchronous divider circuits, wherein a local synchronous divider circuit of the plurality of local synchronous divider circuits comprises
an inverter configured to invert the serial clock signal to generate an inverted serial clock signal,
a first latch comprising data and clock inputs and an output, wherein the data input of the first latch is configured to receive the reset signal and the clock input of the first latch is configured to receive the inverted serial clock signal,
a second latch comprising data and clock inputs and an output, wherein the data input of the second latch is configured to receive the reset signal and the clock input of the second latch is configured to receive the serial clock signal,
a first NAND gate comprising first and second inputs and an output, wherein the first input of the first NAND gate is configured to receive an output of the first; latch, and
a second NAND gate comprising first and second inputs and an output, wherein the first input of the second NAND gate is configured to receive an output of the second latch.

5. The apparatus of claim 4, wherein the local synchronous divider circuit further comprises:
a third latch comprising data and clock inputs and an output, wherein the data input of the third latch is configured to receive the output of the first NAND gate, the clock input of the third latch is configured to receive the inverted serial clock signal, and the output of the third latch is coupled to the second input of the second NAND gate; and
a fourth latch comprising data and clock inputs and an output, wherein the data input of the fourth latch is configured to receive the output of the second NAND gate, the clock input of the fourth latch is configured to receive the serial clock signal, and the output of the fourth latch is coupled to the second input of the first NAND gate.

6. The apparatus of claim 5, wherein the local synchronous divider circuit further comprises:
a third NAND gate comprising first and second inputs and an output, wherein the first input of the third NAND gate is configured to receive the output of the third latch, and the second input of the third NAND gate is configured to receive the output of the fourth latch; and
a divide-by-N circuit having clock and reset inputs and an output, wherein the reset input of the divide-by-N circuit is configured to receive the output of the third NAND gate, and the output of the divide-by-N circuit provides the local clock signal from the local synchronous divider circuit.

7. The apparatus of claim 6, wherein the local synchronous divider circuit further comprises:
a clock selector comprising first and second clock inputs, first and second control inputs and an output, wherein the first clock input of the clock selector is configured to receive the inverted serial clock signal, the second clock input of the clock selector is configured to receive the serial clock signal, the first control input of the clock selector is configured to receive the output of the third latch, the second control input of the clock selector is configured to receive the output of the fourth latch, and the output of the clock selector is coupled to the clock input of the divide-by-N circuit.

8. A method comprising:
distributing a serial clock signal to a plurality of local synchronous divider circuits;
distributing a reset signal to the plurality of local synchronous divider circuits; and
generating a local clock signal at each of the plurality of local synchronous divider circuits, wherein generating the local clock signal comprises
inverting the serial clock signal to generate an inverted serial clock signal, and
generating a synchronized reset signal by synchronizing the reset signal into either a first clock domain of the serial clock signal or a second clock domain of the inverted serial clock signal,
selecting the inverted serial clock signal as an input clock signal if the first latch circuit latches the reset signal before the second latch circuit latches the reset signal, and
selecting the serial clock signal as the input clock signal if the second latch circuit latches the reset signal before the first latch circuit latches the reset signal.

9. The method of claim 8, wherein generating the synchronized reset signal comprises:
latching the reset signal by a first latch circuit which is triggered by an edge of the inverted serial clock signal; and
latching the reset signal by a second latch circuit which is triggered by an edge of the serial clock signal.

10. The method of claim 9, wherein generating the synchronized reset signal further comprises:
synchronizing the reset signal to the edge of the inverted serial clock signal if the first latch circuit latches the reset signal before the second latch circuit latches the reset signal; and
synchronizing the reset signal to the edge of the serial clock signal if the second latch circuit latches the reset signal before the first latch circuit latches the reset signal.

11. The method of claim 8, wherein generating the local clock signal further comprises
dividing the input clock signal using a divide-by-N circuit to generate the local clock signal.

12. A synchronous divider circuit comprising:
a first input configured to receive a reset signal;
a second input configured to receive a serial clock signal;
an inverter configured to invert the serial clock signal to generate an inverted serial clock signal;
a first latch comprising data and clock inputs and an output, wherein the data input of the first latch is configured to receive the reset signal and the clock input of the first latch is configured to receive the inverted serial clock signal;
a second latch comprising data and clock inputs and an output, wherein the data input of the second latch is configured to receive the reset signal and the clock input of the second latch is configured to receive the serial clock signal;
a first NAND gate comprising first and second inputs and an output, wherein the first input of the first NAND gate is configured to receive an output of the first latch;
a second NAND gate comprising first and second inputs and an output, wherein the first input of the second NAND gate is configured to receive an output of the second latch;
a third latch comprising data and clock inputs and an output, wherein the data input of the third latch is configured to receive the output of the first NAND gate, the clock input of the third latch is configured to receive the inverted serial clock signal, and the output of the third latch is coupled to the second input of the second NAND gate; and
a fourth latch comprising data and clock inputs and an output, wherein the data input of the fourth latch is configured to receive the output of the second NAND gate, the clock input of the fourth latch is configured to receive the serial clock signal, and the output of the fourth latch is coupled to the second input of the first NAND gate.

13. The synchronous divider circuit of claim 12, further comprising:
a third NAND gate comprising first and second inputs and an output, wherein the first input of the third NAND gate is configured to receive the output of the third latch, and the second input of the third NAND gate is configured to receive the output of the fourth latch;
a divide-by-N circuit having clock and reset inputs and an output, wherein the reset input of the divide-by-N circuit is configured to receive the output of the third NAND gate, and the output of the divide-by-N circuit provides the local clock signal from the local synchronous divider circuit; and
a clock selector comprising first and second clock inputs, first and second control inputs and an output, wherein the first clock input of the clock selector is configured to receive the inverted serial clock signal, the second clock input of the clock selector is configured to receive the serial clock signal, the first control input of the clock selector is configured to receive the output of the third latch, the second control input of the clock selector is configured to receive the output of the fourth latch, and the output of the clock selector is coupled to the clock input of the divide-by-N circuit.

* * * * *